United States Patent
Florence, Jr. et al.

(10) Patent No.: US 6,674,297 B1
(45) Date of Patent: Jan. 6, 2004

(54) MICRO COMPLIANT INTERCONNECT APPARATUS FOR INTEGRATED CIRCUIT DEVICES

(75) Inventors: Robert F. Florence, Jr., Poughkeepsie, NY (US); Emanuele F. Lopergolo, Marlboro, NY (US); Vincent P. Mulligan, Port Ewen, NY (US); Charles R. Tompkins, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/193,006

(22) Filed: Jul. 9, 2002

(51) Int. Cl.[7] .......................... G01R 31/02; G01R 1/073
(52) U.S. Cl. ........................................ 324/761; 324/754
(58) Field of Search ................................ 324/754, 755, 324/758, 761; 439/75, 482

(56) References Cited

U.S. PATENT DOCUMENTS

| | | | | |
|---|---|---|---|---|
| 4,082,399 A | * | 4/1978 | Barkhuff | 439/264 |
| 5,215,472 A | * | 6/1993 | DelPrete et al. | 439/71 |
| 5,702,255 A | * | 12/1997 | Murphy et al. | 439/71 |
| 5,982,187 A | * | 11/1999 | Tarzwell | 324/756 |
| 5,990,697 A | * | 11/1999 | Kazama | 324/761 |
| 6,104,205 A | * | 8/2000 | Mawby | 324/761 |
| 6,137,296 A | | 10/2000 | Yoon et al. | 324/754 |
| 6,208,155 B1 | | 3/2001 | Barabi et al. | 324/754 |
| 6,261,130 B1 | | 7/2001 | Huynh et al. | 439/700 |
| 6,288,555 B1 | | 9/2001 | Harris | 324/637 |
| 6,310,484 B1 | | 10/2001 | Akram et al. | 324/754 |
| 6,316,954 B1 | | 11/2001 | Venaleck et al. | 324/761 |
| 6,350,137 B1 | | 2/2002 | Shimada | 439/266 |
| 6,384,470 B2 | | 5/2002 | Kobayashi et al. | 257/621 |

* cited by examiner

Primary Examiner—Ernest Karlsen
(74) Attorney, Agent, or Firm—Floyd A. Gonzalez; Cantor Colburn LLP

(57) ABSTRACT

A micro compliant, test probe interconnect apparatus for an integrated circuit device is disclosed. In an exemplary embodiment, the apparatus includes an elongated housing and a probe pin extending from a first end of the housing. A biasing mechanism holds the probe pin in a normally extended position, wherein the biasing mechanism is formed from a portion of the elongated housing. In a preferred embodiment, the biasing mechanism is a flexible tab, formed from a generally rectangular section of the elongated housing and bent inwardly therein to form a cantilever.

19 Claims, 4 Drawing Sheets

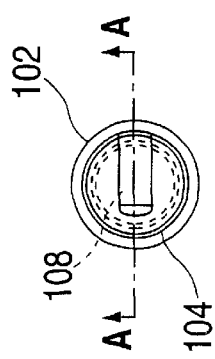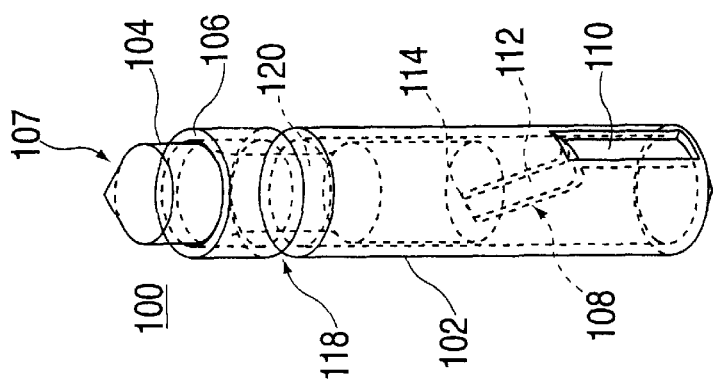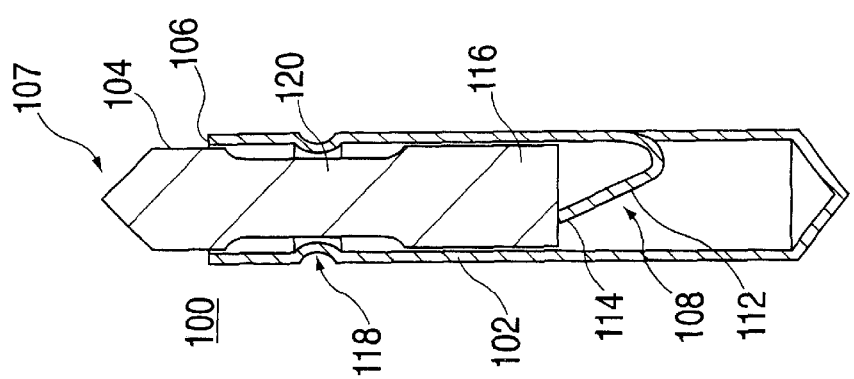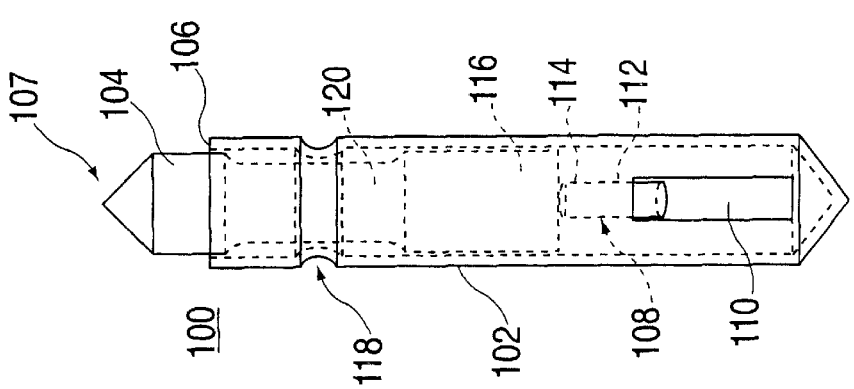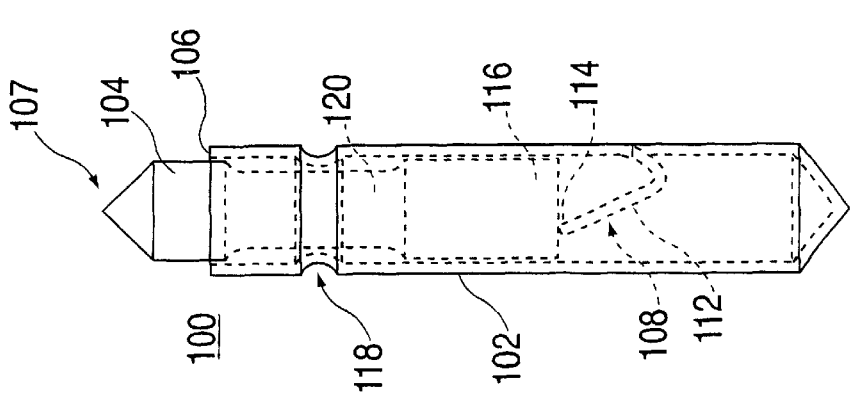

MICRO COMPLIANT INTERCONNECT APPARATUS FOR INTEGRATED CIRCUIT DEVICES

BACKGROUND

The present invention relates generally to interconnect devices for integrated circuits (ICs) and, more particularly, to a micro compliant interconnect apparatus for use in devices such as socket test probes.

Probe systems for both electrical testing and permanent interconnection of electronic circuits continue to grow in importance as contact densities increase. Current design trends for chips, modules and cards/boards are pushing the limits of available testing technology.

Multi-layer ceramic (MLC) substrates are well known in the art. Generally, an MLC substrate includes both ceramic layers and metal layers that are stacked to form a laminated (interdigitated) block in which the metal and ceramic layers alternate. With large and complex multi-layer ceramic substrate footprints, the interconnection integrity of the input/output (I/O) signals, and the power and ground to the source is highly dependent on the flatness of the substrate. Consequently, factors such as the substrate camber and waviness contribute to the difficulties of making a good reliable interconnection of the substrate to its source. Such factors, in turn are dependent upon the substrate design, sinter parameters, and other random factors which are nearly impossible to predict.

Accordingly, these IC devices are tested in a manner such that a reliable electrical interface must be achieved between the test probes and the IC device in order to produce reliable test results. Conventional testing devices typically utilize an array of individual conductive probes called "pogo pins", which provide a compliant contact array to electrically interface with the I/O contacts of the IC device. Generally, the tips of the pogo pins are designed to achieve efficient electrical contact between the pogo pin tip and the tested or contacted device, and to minimize the introduction of contact resistance in the signal path. A conventional pogo pin generally includes four components: an elongated barrel, a compression spring, and a pair of probe tips extending from opposite ends of the barrel, wherein the compression spring is compressed between the inner ends of the probe tips to hold the tips in a normally extended position.

The constituent parts of a pogo pin are individually produced by machining, and are thereafter assembled into a pogo pin. As a result, the per-pin manufacturing costs are generally very high. In turn, the costs incurred by the manufacture of a socket increase in proportion to an increase in the number of external connection terminals of an IC to be tested. Furthermore, the manufacturing accuracy (i.e., variations in the position and height of a contact) has practical limitations.

In addition to the manufacturing costs thereof, the use of pogo pins can also become problematic over time. For example, one or both of the probe tips of the pogo pin may become stuck within the barrel due to a mechanical failure. As a result, physical contact is not established between the pogo pin and the external connection terminal of the IC under test. Accordingly, any defective pogo pins should be immediately replaced so that an IC is not erroneously determined to be defective. However, as suggested above, the replacement of a defective pogo pin involves a number of operations, the identification of the defective pogo pin(s), disassembly of a socket, and replacement of the defective pogo pin(s) with a non-defective one, thereby consuming manpower and time.

BRIEF SUMMARY

The foregoing discussed drawbacks and deficiencies of the prior art are overcome or alleviated by a test probe interconnect apparatus for an integrated circuit device. In an exemplary embodiment, the apparatus includes an elongated housing and a probe pin extending from a first end of the housing. A biasing mechanism holds the probe pin in a normally extended position, wherein the biasing mechanism is formed from a portion of the elongated housing. In a preferred embodiment, the biasing mechanism is a flexible tab, formed from a generally rectangular section of the elongated housing and bent inwardly therein to form a cantilever.

In another embodiment, a test probe interconnect apparatus for an integrated circuit device includes an elongated housing formed from an elastic, conductive material, and a probe pin extending from a first end of the elongated housing. A biasing mechanism, formed from a portion of the elongated housing, is used for holding the probe pin in a normally extended position. The biasing mechanism further includes a first flexible tab configured into a first cantilever spring, and a second flexible tab configured into a second cantilever spring. The first and second cantilever springs are each formed from a generally rectangular section of the elongated housing, bent inwardly therein.

BRIEF DESCRIPTION OF THE DRAWINGS

Referring to the exemplary drawings wherein like elements are numbered alike in the several Figures:

FIGS. 2(a) and 2(b) are elevational views of a test probe interconnect structure, in accordance with a first embodiment of the invention;

FIG. 2(c) is a top view of the first embodiment shown in FIGS. 2(a) and 2(b);

FIG. 2(d) is a cross-sectional view of the first embodiment of the interconnect structure, taken along the lines A—A of FIG. 2(c);

FIG. 2(e) is a perspective view of the first embodiment of the interconnect structure;

DETAILED DESCRIPTION

Figure 1A:
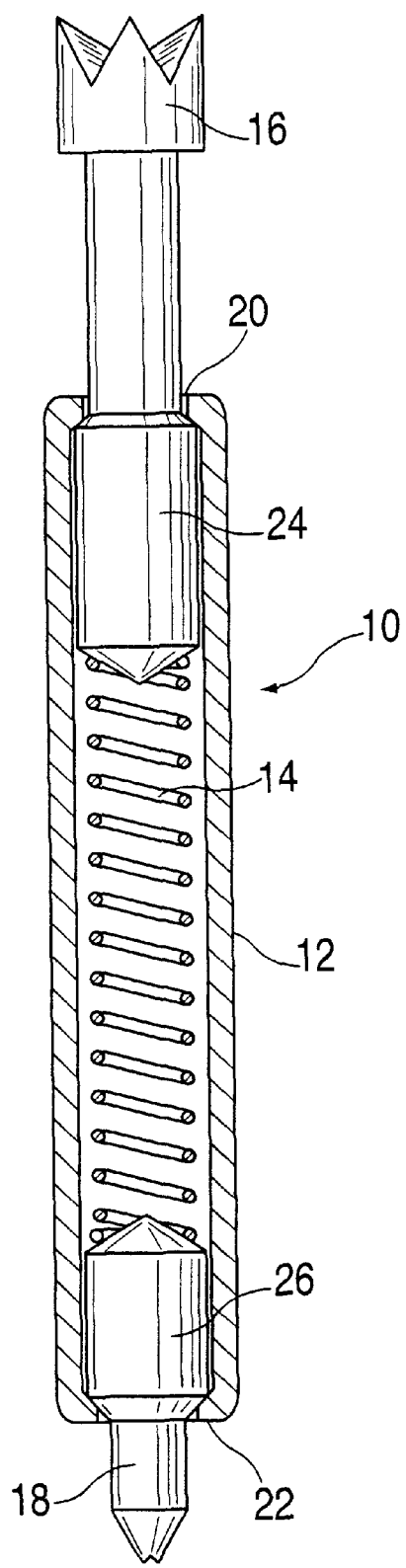
FIGS. 1(a) and 1(b) are cross sectional views of an existing contact pin structure.
Figure 1B:
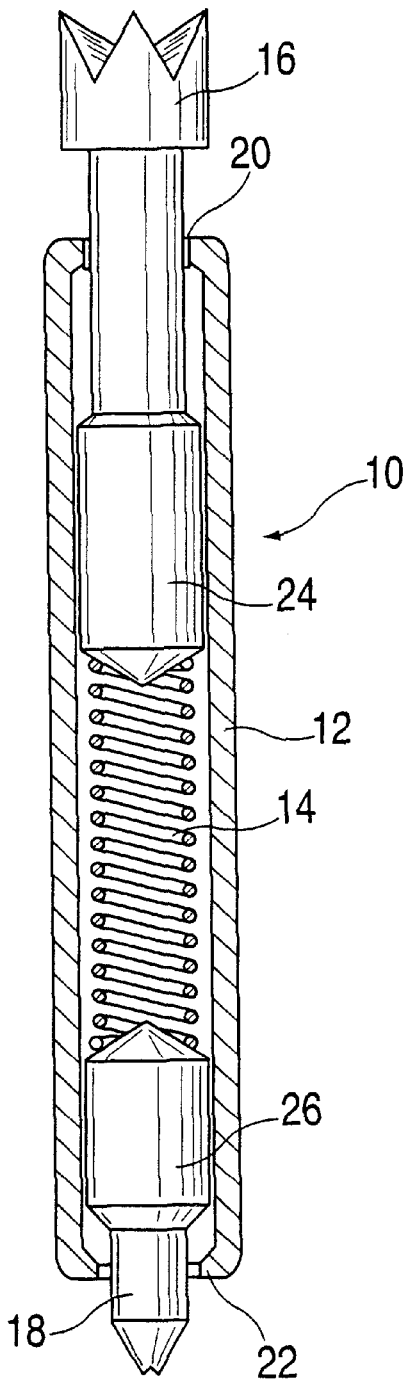
Figure 3C:
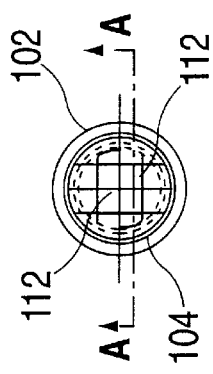
FIG. 3(c) is a top view of the second embodiment shown in FIGS. 3(a) and 3(b)
Figure 3E:
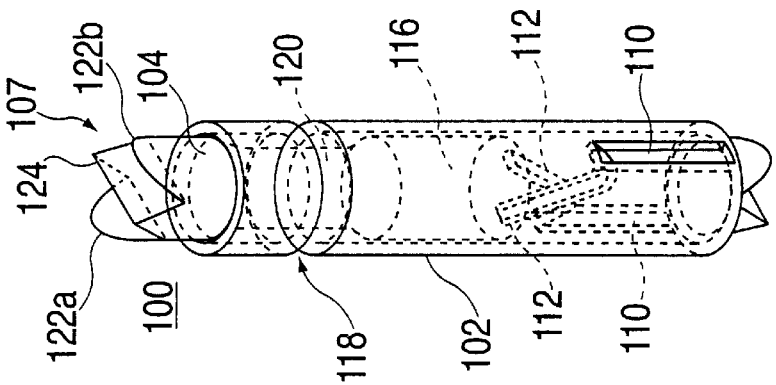
FIG. 3(e) is a perspective view of the second embodiment of the interconnect structure.
Figure 3D:
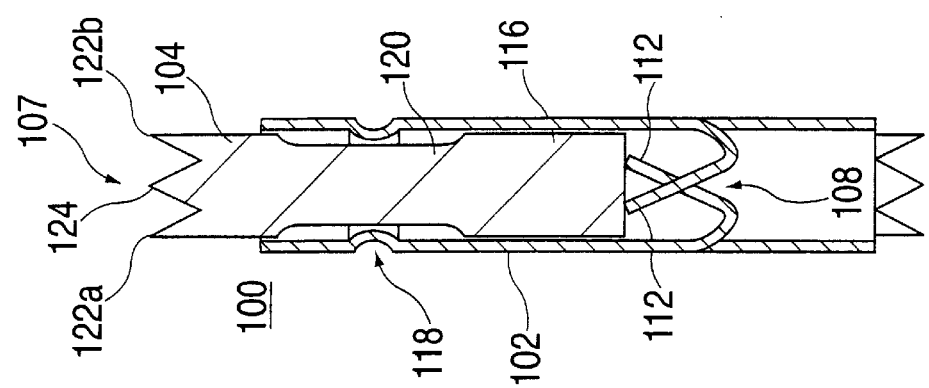
FIG. 3(d) is a cross-sectional view of the second embodiment of the interconnect structure, taken along the lines A—A of FIG. 3(c)
Figure 3B:
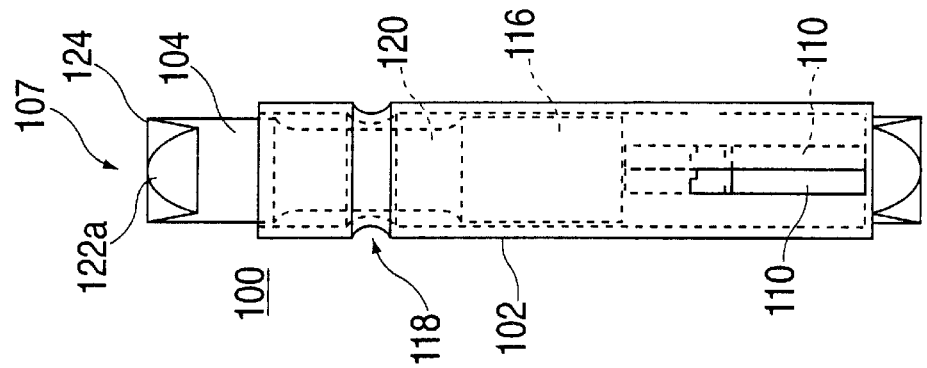
FIGS. 3(a) and 3(b) are elevational views of a test probe interconnect structure, in accordance with a second embodiment of the invention.
Figure 3A:
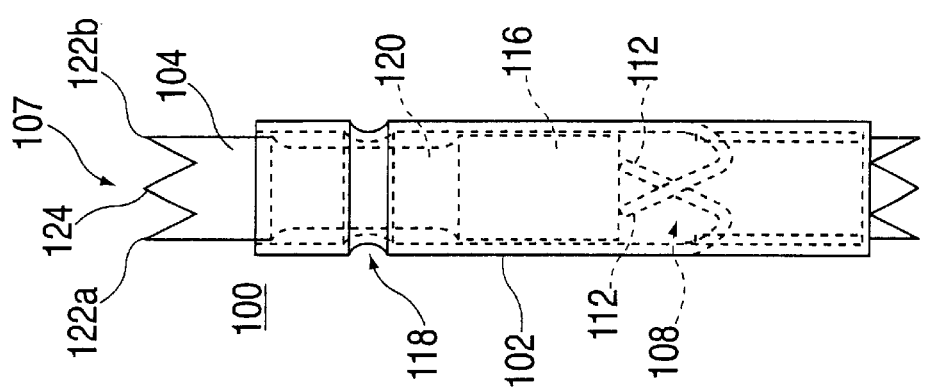

Referring initially to FIGS. 1(a) and 1(b), there is shown a cross sectional view of an existing pogo pin structure 10. The pin structure 10 includes an elongated spring barrel 12, a compression spring 14, and a pair of probe tips 16, 18 extending from opposite ends 20, 22 of the spring barrel 12. The compression spring 14 abuts the internal ends 24, 26 of the probe tips 16, 18 to hold the probe tips in a normally extended position, as shown in FIG. 1(a). As the probe tips 16, 18 are contacted, they depress against the restoring force of the compression spring, as shown in FIG. 1(b), to provide a compliant contact.

As stated previously, however, there are certain disadvantages associated with using a conventional compression spring in the conventional pogo pin assembly. First, there are the manufacturing costs associated with the manufacture and assembly of the individual parts. In addition, the springs are subject to mechanical wear, resulting in part from the increased surface area of contact between the springs and the probe tips. More specifically, there is rubbing of the spring 14 against the inner wall of the spring barrel 12. Furthermore, there is also rubbing of the spring 14 against the ends 24, 26 of the probe tips 16, 18. Such rubbing tends to create small metal filings or dust that causes an increase in contact resistance as the device is actuated over a period of time.

Therefore, in accordance with an embodiment of the invention, there is disclosed a micro compliant, test probe interconnect apparatus for making electrical contact with input/output (I/O) structures such as, for example, a Pin Grid Array (PGA) or pads on a Land Grid Array (LGA) of integrated circuit package. The electrical contact is achieved through the use of a two-part probe structure that maintains a constant force against the pad/pin of an integrated circuit package to be tested, burned-in, or used as an integral part of a system. Broadly stated, a biasing mechanism is formed directly from the housing material of the structure so as to allow for an inexpensive, simple system that provides desired electrical contact while not damaging the integrated circuit package. This in turn leads to a high-volume manufacturing environment with lower costs associated therewith.

Referring generally now to FIGS. 2(a) through 2(e), a first embodiment of a test probe interconnect apparatus 100 is illustrated. The apparatus 100 includes elongated housing 102 and a probe pin 104 extending from a first end 106 of the housing 102. The outer end of the probe pin 104 terminates in a probe tip 107, illustrated as a single point in the figures. However, as will be discussed later, the probe tip 107 can also be provided in several different multiple-point configurations, depending upon the desired application. Both the housing 102 and probe pin 104 are made from a conductive material. Exemplary materials suitable for the probe pin include phosphor bronze (phos bronze) or copper. The housing 102, in addition to being conductive, is also preferably constructed from a material containing spring like properties, such as beryllium copper, for reasons which will become apparent hereinafter.

In order to provide the desired compliance, a biasing mechanism 108 is used for holding the probe pin 104 in a normally extended position. However, unlike the compression spring found in a conventional pogo pin, the biasing mechanism 108 is a tab formed directly from the housing material itself. As is shown most particularly in FIGS. 2(b) and 2(e), the tab is formed by creating a generally rectangular notch 110 in the housing 102 by cutting, stamping or punching the housing material along three edges. The tab is then bent inwardly with respect to the housing 102, thereby forming a cantilever 112 that serves as a biasing spring. As can be seen, the free end 114 of the cantilever 112 comes into contact with the inner end 116 of the probe pin 104, such that when the probe pin 104 is in a depressed state, the inner end 116 acts against the restoring force of the cantilever 112. Those skilled in the art will appreciate that a wide range of compliance forces provided by the cantilever is possible by varying certain design parameters such as the tab length and width, the thickness of the housing 102, and heat treatment of the selected housing material.

In addition to the cantilever 112, the housing 102 is also provided with a crimped portion 118. The crimped portion 118 prevents the probe pin 104 from becoming completely disengaged from the housing, while still allowing a range of movement of the probe pin 104. This range of movement is defined by the length of a neck portion 120 of the probe pin 104. Furthermore, although FIGS. 2(a) through 2(e) depict a "single probe pin" embodiment, it will be appreciated that the housing 102 may also be configured so as to include an additional probe pin and corresponding cantilever (not shown) at the opposite end thereof.

FIGS. 3(a) through 3(e) illustrate an alternative embodiment of the test probe interconnect apparatus 100. In this embodiment, a pair of cantilevers 112 is used to form the biasing mechanism 108 for the probe pin 104. As is the case with the first embodiment, each cantilever 112 comprises a tab formed by creating rectangular notches 110 within the housing 102. Since the cantilevers 112 are inwardly disposed and are created on substantially opposing surfaces of the housing 102, the notches 110 are slightly offset with respect to the centerline of the housing 102. This is illustrated most particularly in FIG. 3(c).

Also shown in FIGS. 3(a)–3(e) is an alternative configuration for the tip 107 of the probe pin 104. In this embodiment, the tip 107 includes three separate apex points, two exterior edges 122a, 122b, along opposite sides of the tip 107 and a third edge 124 at about the center of the tip 107. Those skilled in the art will realize, however, that other tip geometries may be used to allow for single point or multiple point contact, depending upon the type of surface to be contacted (e.g., solder ball, pad surface, etc.).

As will be appreciated, the cantilever configuration of the present invention embodiments offer several advantages over the existing pogo pin structure. First, there are fewer components associated with the cantilever configuration, resulting in decreased manufacturing complexity and cost. In addition, there is less mechanical rubbing associated with the cantilever configuration since the cantilever is formed by inwardly bending a portion of the housing material. This helps to prevent an increase in contact resistance by avoiding the formation of dust and metal filing particles on the cantilever. Furthermore, the shape of the cantilever itself provides superior conductivity over a spring, due to its shape and its integration with the housing itself. In the case of the pogo pin assembly, the current path is directed through the coils of the spring, thus resulting in a longer current path with higher impedance.

Figure 4:
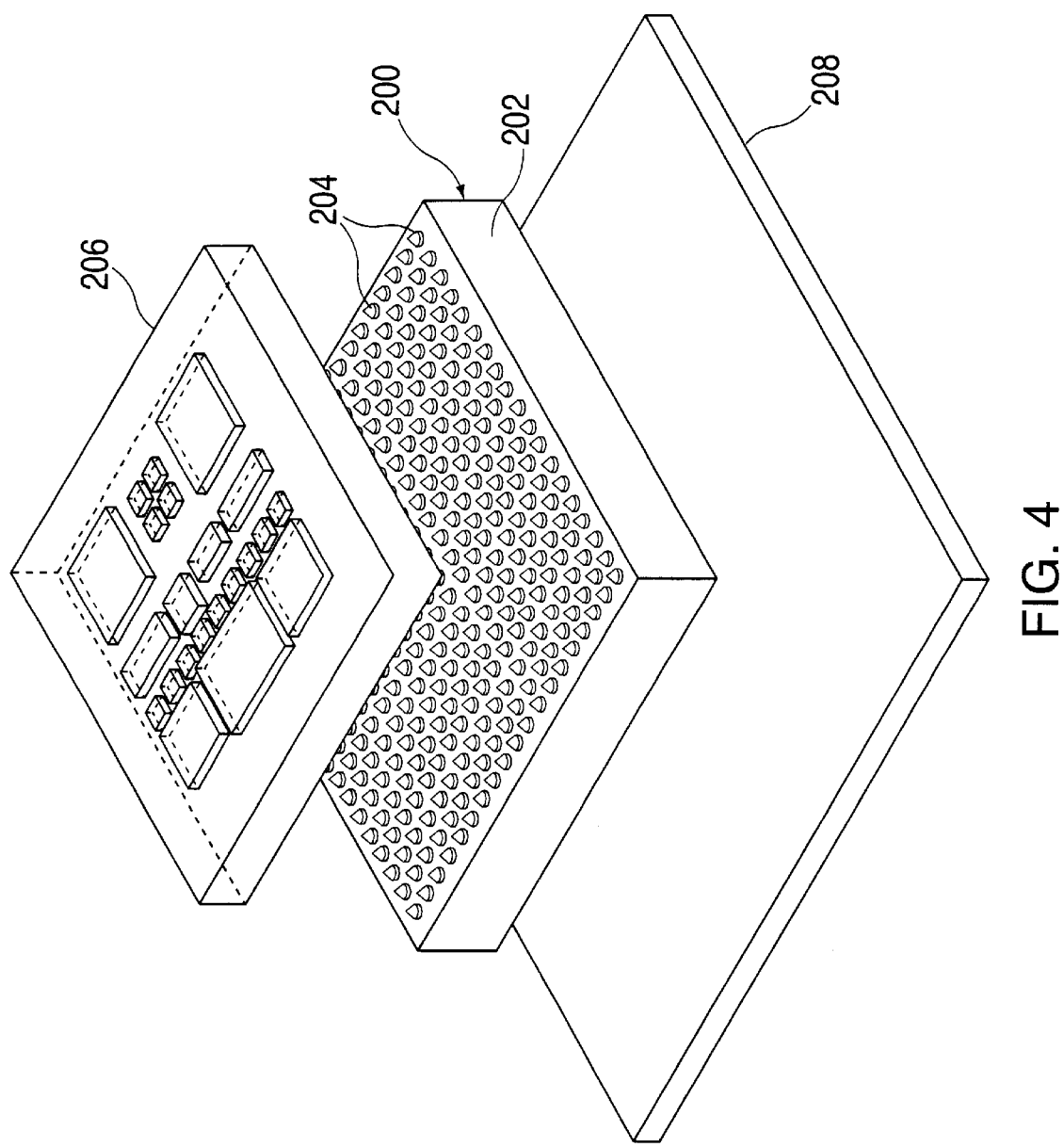
FIG. 4 is a perspective view of a compliant contact assembly for probe testing of integrated circuit devices.

Finally, FIG. 4 illustrates a compliant contact assembly 200 suitable for probe testing of integrated circuit devices. The contact assembly includes an interface block 202 that has an array of individual probe devices 204, such as the interconnect apparatus 100 embodiments described above. In other words, each individual probe device 204 includes an elongated housing with at least one probe pin inserted therein. As shown in FIG. 4, the contact assembly 200 is used as an interface between a testing module 206 and a system board 208 or device under test.

The test probes mounted in housings or on substrates may be used directly on test boards, incorporated into sockets or as part of a connector system. The probes may further be manufactured via high production screw machine techniques and/or high speed stamping/coining techniques. As will be appreciated, the invention embodiments described herein provide for a highly variable scheme that can be adapted to a large variety of requirements. Particular applications for which the present probe structure may be used in conjunction with include, but are not limited to, area array modules such as PGA (Pin Grid Array), CBGA (Ceramic Ball Grid Array), CCGA (Ceramic Column Grid Array), CLGA (Ceramic Land Grid Array), testing and card/board interconnect, interposer and testing.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A test probe interconnect apparatus for an integrated circuit device, comprising:

an elongated housing;

a probe pin, extending from a first end of said elongated housing; and a biasing mechanism for holding said probe pin in a normally extended position;

said biasing mechanism further comprising a flexible tab configured into a cantilever, wherein said flexible tab is formed from a generally rectangular section of said elongated housing, said rectangular section being bent inwardly into said elongated housing.

2. The test probe interconnect apparatus of claim 1, wherein said flexible tab is bent inwardly and toward the direction of said first end of said elongated housing.

3. The test probe interconnect apparatus of claim 1, wherein said elongated housing further comprises a crimped portion, disposed proximate said first end of said elongated housing, said crimped portion for retaining said probe pin within said elongated housing.

4. The test probe interconnect apparatus of claim 1, wherein said elongated housing is beryllium copper.

5. The test probe interconnect apparatus of claim 1, wherein said probe pin is phosphor bronze.

6. The test probe interconnect apparatus of claim 1, wherein said probe pin is copper.

7. The test probe interconnect apparatus of claim 3, wherein said probe pin further comprises a neck portion formed between opposing ends of said probe pin, said neck portion having a length which defines a range of travel of said probe pin within the interior of said elongated housing.

8. The test probe interconnect apparatus of claim 7, wherein said probe pin terminates in at least one point structure, thereby defining a tip of said probe pin.

9. A test probe interconnect apparatus for an integrated circuit device, comprising:

an elongated housing formed from an elastic, conductive material;

a probe pin, extending from a first end of said elongated housing; and a biasing mechanism for holding said probe pin in a normally extended position, said biasing mechanism further comprising:

a first flexible tab configured into a first cantilever spring; and a second flexible tab configured into a second cantilever spring;

said first and second cantilever springs each being formed from a generally rectangular section of said elongated housing bent inwardly therein.

10. The test probe interconnect apparatus of claim 9, wherein said elongated housing further comprises a crimped portion, disposed proximate said first end of said elongated housing, said crimped portion for retaining said probe pin within said elongated housing.

11. The test probe interconnect apparatus of claim 9, wherein said elongated housing is beryllium copper.

12. The test probe interconnect apparatus of claim 9, wherein said probe pin is phosphor bronze.

13. The test probe interconnect apparatus of claim 9, wherein said probe pin is copper.

14. The test probe interconnect apparatus of claim 10, wherein said probe pin further comprises a neck portion formed between opposing ends of said probe pin, said neck portion having a length which defines a range of travel of said probe pin within the interior of said elongated housing.

15. The test probe interconnect apparatus of claim 14, wherein said probe pin terminates in at least one point structure, thereby defining a tip of said probe pin.

16. A compliant contact assembly for probe testing of integrated circuit devices, comprising:

an interface block having an array of individual probe devices, each of said individual probe devices including an elongated housing, a depressable probe pin extending from a first end of said elongated housing, and a biasing mechanism for holding said probe pin in a normally extended position, said biasing mechanism further comprising a flexible tab configured into a cantilever spring by inwardly bending a generally rectangular section of said elongated housing.

17. The compliant contact assembly of claim 16, wherein said flexible tab is bent inwardly and toward the direction of said first end of said elongated housing.

18. The compliant contact assembly of claim 16, wherein said elongated housing further comprises a crimped portion, disposed proximate said first end of said elongated housing, said crimped portion for retaining said probe pin within said elongated housing.

19. The compliant contact assembly of claim 18, wherein said probe pin further comprises a neck portion formed between opposing ends of said probe pin, said neck portion having a length which defines a range of travel of said probe pin within the interior of said elongated housing.

* * * * *